United States Patent
Liu

(10) Patent No.: US 7,405,571 B1
(45) Date of Patent: Jul. 29, 2008

(54) METHODS AND APPARATUSES FOR DETERMINING BATTERY CAPACITY

(75) Inventor: David S. C. Liu, Newton, MA (US)

(73) Assignee: HDM Systems Corporation, Allston, MA (US)

( * ) Notice: Subject to any disclaimer, the term of this patent is extended or adjusted under 35 U.S.C. 154(b) by 323 days.

(21) Appl. No.: 11/226,651

(22) Filed: Sep. 13, 2005

Related U.S. Application Data

(60) Provisional application No. 60/610,053, filed on Sep. 15, 2004.

(51) Int. Cl.
*G01N 27/416* (2006.01)
(52) U.S. Cl. .................... 324/430; 702/65; 320/132
(58) Field of Classification Search ............. 324/430, 324/425, 426, 427; 320/132; 702/65
See application file for complete search history.

(56) References Cited

U.S. PATENT DOCUMENTS

| | | | | |
|---|---|---|---|---|
| 5,760,568 A | * | 6/1998 | Naskali .................... 320/139 |
| 6,563,318 B2 | * | 5/2003 | Kawakami et al. ........... 324/426 |
| 6,661,231 B1 | * | 12/2003 | Arai et al. .................. 324/426 |
| 6,832,171 B2 | * | 12/2004 | Barsoukov et al. ............ 702/65 |
| 7,062,390 B2 | * | 6/2006 | Kim et al. .................... 702/63 |
| 7,190,171 B2 | * | 3/2007 | Kawakami et al. .......... 324/430 |
| 2006/0125482 A1 | * | 6/2006 | Klang et al. ................. 324/426 |

* cited by examiner

*Primary Examiner*—Matthew V Nguyen
*Assistant Examiner*—Nguyen Tran
(74) *Attorney, Agent, or Firm*—Blakely, Sokoloff, Taylor & Zafman LLP

(57) ABSTRACT

Methods and apparatuses for determining a battery capacity are described. According to one embodiment, an exemplary method includes generating virtual calibration data of the battery based on one or more characteristics of the battery, determining a virtual open circuit voltage (Voc) of the battery while the battery is being used, and estimating the capacity of the battery based on the determined virtual open circuit voltage of the battery and the virtual calibration data of the battery, while the battery is being used.

18 Claims, 12 Drawing Sheets

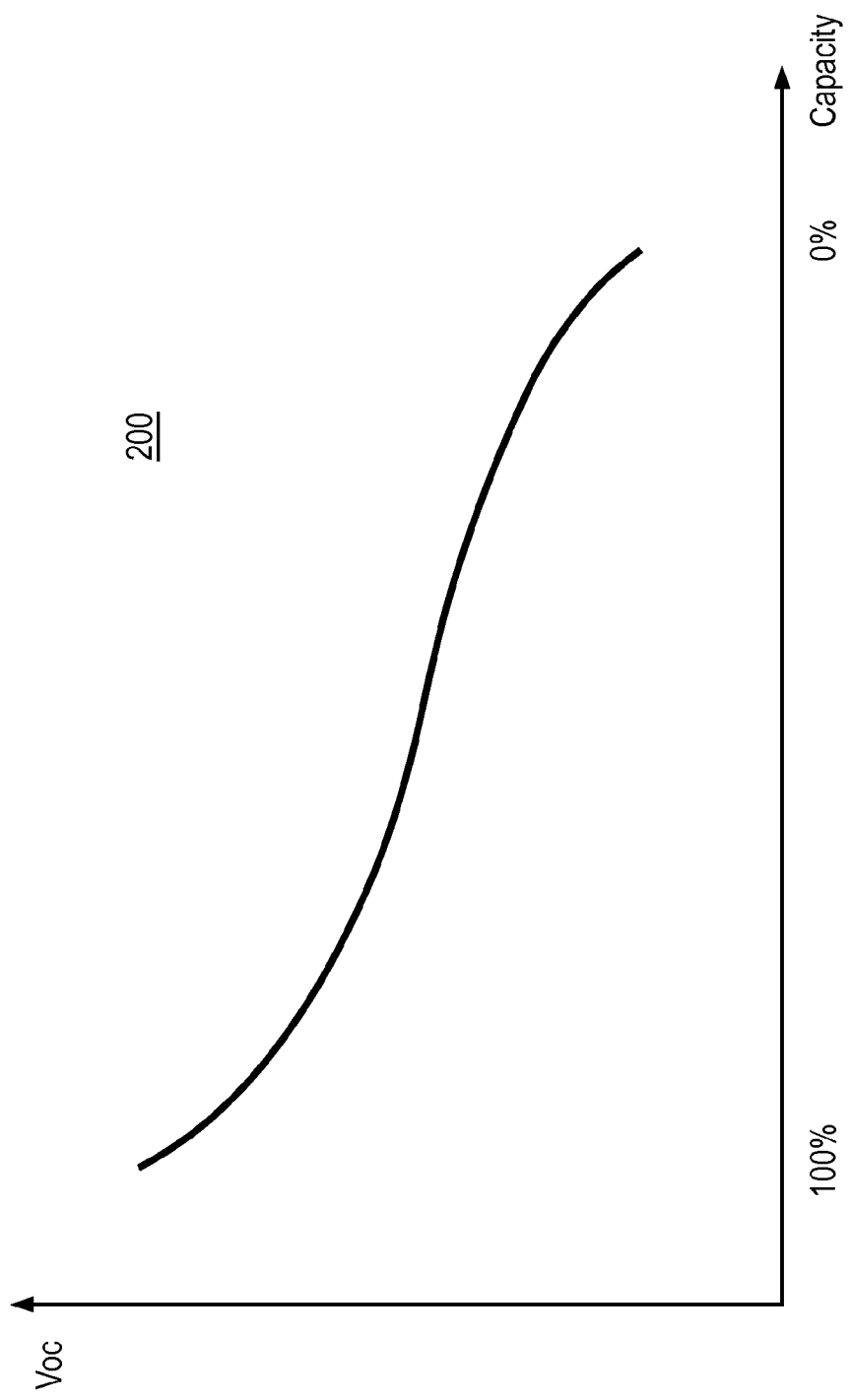

400

401 Measure a first voltage V1 of a battery being discharged by a first load I1

402 Apply a second load I2 to the battery in addition to the first load I1

403 Measure a second voltage V2 while the second load I2 is being applied

404 Determine an internal impedance Ri based on the first and second loads, as well as the first and second voltages (e.g., Ri = |V2 - V1| / |I2 - I1|)

405 Calculate a virtual open circuit voltage Voc based in part on the internal impedance Ri (e.g., Voc = V1 + I1 Ri)

406 Determine the battery capacity based on the virtual open circuit voltage Voc

Apply a first load I1 to a battery being charged at Ich and obtain a first voltage V1
601

Apply a second load I2 to the battery in addition to the first load I1 and obtain a second voltage V2
602

Determine an internal impedance Ri based on the first and second voltages and loads
(e.g., $Ri = |V2 - V1| / |I2 - I1|$)
603

Calculate a virtual open circuit voltage Voc based in part on the internal impedance Ri
(e.g., $Voc = V1 + |I1 - Ich| Ri$)
604

Determine the battery capacity based on the virtual open circuit voltage Voc
605

FIG. 6

| Segments 901 | Voc (Ri) (volt) 902 | Amp-hour (AH) 903 | Capacity (%) 904 | First Choice (AH Capacity of 903) 905 | Second Choice (AH Capacity of 903) 906 | Third Choice (AH Capacity of 903) 907 | Other Choices 908 |
|---|---|---|---|---|---|---|---|
| 1 | 13.1 - 13.0 | 0 | 100 | ☐ 1 : 100 | ☐ [1 : 50] * 2 | ☐ [1 : 25] * 3 + ☐ [1 : 25] | |
| 2 | 13.0 - 12.9 | 0.1 | 99.8 | ☐ 2 : 100 | ☐ [2 : 50] + ☐ [1 : 50] | ☐ [1 : 25] * 3 + ☐ [2 : 25] | |
| 3<br>4<br>5 | 12.9 - 12.8<br>12.8 - 12.7<br>12.7 - 12.65 | 0.1<br>0.1<br>1.5 | 99.6<br>99.8<br>96.4 | ☐ 3 : 100<br>☐ 4 : 100<br>☐ 5 : 100 | ☐ [3 : 50] + ☐ [1 : 50]<br>☐ [4 : 50] + ☐ [1 : 50]<br>☐ [5 : 50] + ☐ [1 : 50] | ☐ [1 : 25] * 3 + ☐ [3 : 25]<br>☐ [1 : 25] * 3 + ☐ [4 : 25]<br>☐ [1 : 25] * 3 + ☐ [5 : 25] | |
| ... | ... | ... | ... | | | | |
| 25 | 12.45 - 12.40 | 2.3 | 75 | ☐ 25 : 100 | ☐ [25 : 50] + ☐ [1 : 50] | ☐ [1 : 25] * 3 + ☐ [25 : 25] | |
| 26 | 12.40 - 12.35 | 2.1 | 71 | ☐ 26 : 100 | ☐ [26 : 50] + ☐ [1 : 50] | NA | |
| ... | ... | ... | ... | | | | |
| 50 | 12.15 - 12.10 | 1.9 | 50% | ☐ 50 : 100 | ☐ [50 : 50] + ☐ [1 : 50] | NA | |
| 51 | 1.8 | 1.8 | 46.4 | ☐ 51 : 100 | NA | NA | |
| ... | ... | ... | ... | | | | |
| 75 | 11.75 - 11.70 | 1.5 | 25% | ☐ 75 : 100 | NA | NA | |
| 76 | 11.70 - 11.65 | 1.2 | 23 | ☐ 76 : 100 | NA | NA | |
| ... | ... | ... | ... | | | | |
| 100 | 11.0 - 10.9 | 0.2 | 0% | ☐ 100 : 100 | NA | NA | |

METHODS AND APPARATUSES FOR DETERMINING BATTERY CAPACITY

RELATED APPLICATIONS

This application claims the benefit of U.S. Provisional Patent Application No. 60/610,053, entitled "Methods and Apparatuses for Determining Battery Capacity", filed Sep. 15, 2004, which is incorporated by reference herein by its entirety.

FIELD OF THE INVENTION

The present invention relates generally to batteries. More particularly, this invention relates to determining battery capacity.

BACKGROUND OF THE INVENTION

Direct current (DC) energy sources, such as batteries, are used in many situations where constant alternating current (AC) power is not available (e.g., within a vehicle). In many applications, it is desirable or even critical to monitor the charge level of the energy source so that a user has an indication when an energy source is getting low on voltage or is deviating from a desired voltage range, and needs to be recharged or replaced. The voltage level on the energy source is a measurable indicator of charge of the energy source, and can be monitored with a device commonly known as a "monitor" or a "battery monitor" where the source is a battery. Without a monitor, typically the only inherent indication that a user has that the energy source is in a charged state is whether or not it activates the equipment to which it is attached. Many conventional devices exist which measure the voltage level on a battery or other DC energy source and display the charge level through some means (e.g., bar graph, digit readout, mechanical meter).

However, these devices generally lack of accuracy, particularly, when a variety of loads being applied to the battery. Some devices require that the battery being in a "rest" state (e.g., idle for a period of time without any load being applied), in order to obtain certain level of accuracy. However, such as ideal state would not be practical in real life. Better solutions are needed.

SUMMARY OF THE INVENTION

Methods and apparatuses for determining a battery capacity are described. According to one embodiment, an exemplary method includes According to one embodiment, an exemplary method includes generating virtual calibration data of the battery based on one or more characteristics of the battery, determining a virtual open circuit voltage (Voc) of the battery while the battery is being used, and estimating the capacity of the battery based on the determined virtual open circuit voltage of the battery and the virtual calibration data of the battery, while the battery is being used.

BRIEF DESCRIPTION OF THE DRAWINGS

The present invention is illustrated by way of example and not limited in the figures of the accompanying drawings in which like references indicate similar elements.

FIGS. 2A and 2B are diagrams illustrating exemplary virtual calibration curves of a battery according to certain embodiments of the invention.

FIG. 4 is a flow diagram illustrating an exemplary process for determining a capacity of a battery according to one embodiment of the invention.

FIG. 6 is a flow diagram illustrating and exemplary process for determining a capacity of a battery according to another embodiment of the invention.

FIG. 9 is a block diagram illustrating an exemplary mechanism for determining a battery capacity according to another embodiment of the invention.

DETAILED DESCRIPTION

Figure 1:
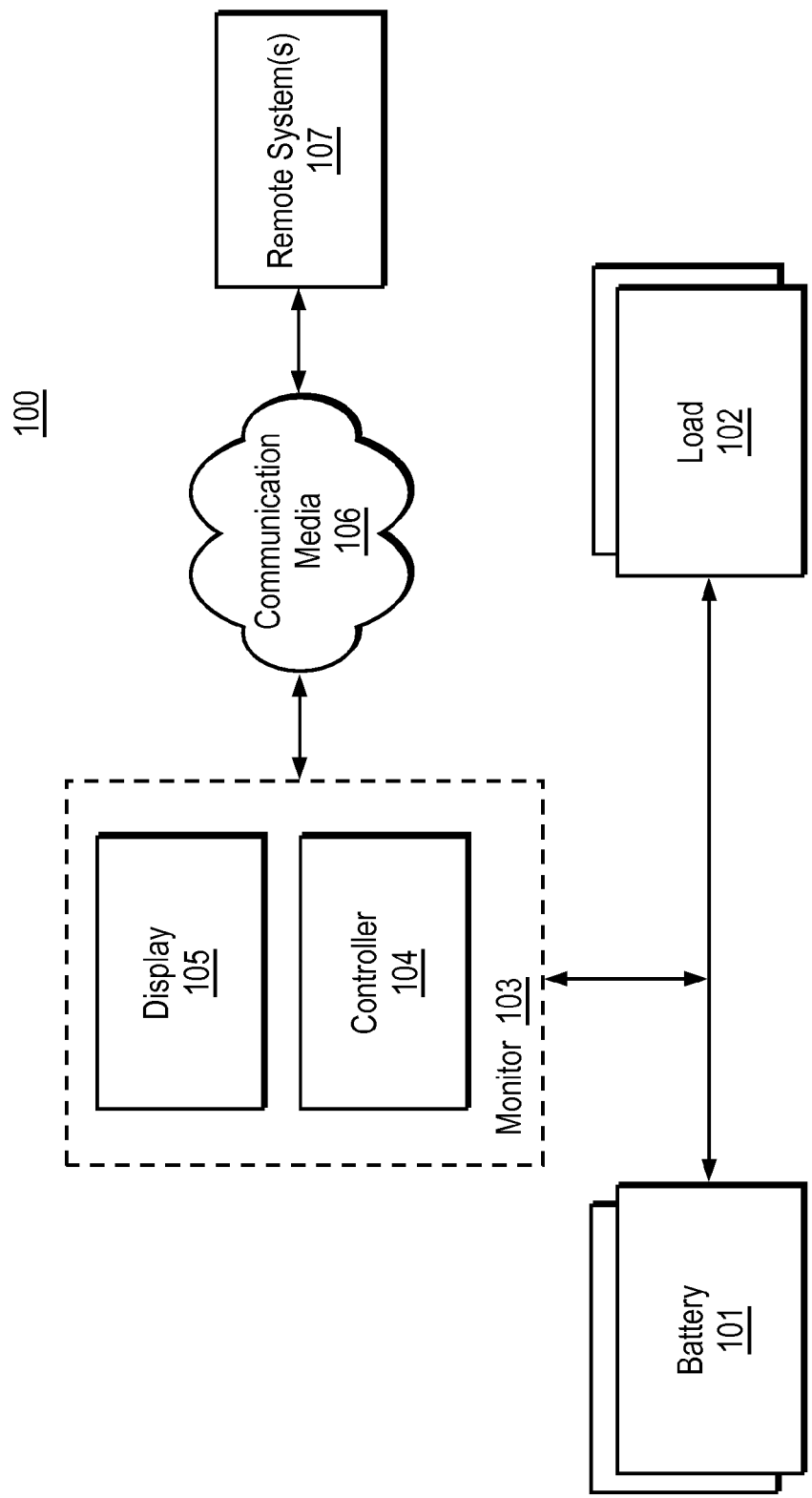
FIG. 1 is a block diagram illustrating an exemplary battery monitoring system according to one embodiment of the invention.

Methods and apparatuses for determining battery capacity are described. In one embodiment, a virtual calibration curve of a battery is derived from an normal discharge or charge curve of the battery. The capacity of the battery is then estimated based on the virtual calibration curve. In the following description, numerous details are set forth to provide a more thorough explanation of the present invention. It will be apparent, however, to one skilled in the art, that the present invention may be practiced without these specific details. In other instances, well-known structures and devices are shown in block diagram form, rather than in detail, in order to avoid obscuring the present invention.

Some portions of the detailed descriptions which follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent finite sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The invention also relates to one or more different apparatuses for performing the operations herein. This apparatus may be specifically constructed for the required purposes (e.g., software, hardware, and/or firmware, etc.), or it may comprise a general purpose computer selectively activated or reconfigured by a computer program stored in the computer. The instructions of such software, firmware, and computer programs may be stored in a machine readable medium, such as, but is not limited to, any type of disk including floppy disks, optical disks, CD-ROMs, and magnetic-optical disks, read-only memories (ROMs) random access memories (RAMs), erasable programmable ROMs (EPROMs), electrically erasable programmable ROMs (EEPROMs), magnetic or optical cards, electrical, optical, acoustical or other forms of prorogated signals (e.g., carrier waves, infrared signals, etc.) or any type of media suitable for storing electronic instructions.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description below. In addition, the present invention is not described with reference to any particular programming language. It will be appreciated that a variety of programming languages may be used to implement the teachings of the invention as described herein.

Exemplary Battery Monitoring System

FIG. 1 is a block diagram illustrating an exemplary battery monitoring system according to one embodiment of the invention. Referring to FIG. 1, exemplary battery monitoring system 100 includes, but is not limited to, one or more batteries 101, one or more loads 102, a monitoring device 103 coupled to the batteries 101 and the loads 102. The monitoring device 103 may be used to monitor the conditions of one or more batteries and determine the capacity of the batteries at real-time. The monitoring device 103 may include a controller 104 and a display device 105, where the controller may perform the monitoring functionality and the capacity of the one or more batteries may be displayed in the display device 105. In one embodiment, for example, exemplary system 100 may be used in a vehicle, where battery 101 is used by the vehicle in various of ways, such as, for example, driving and/or air conditioning, etc. In such an environment, the battery may be charged, discharged, and a combination of both. In one embodiment, the exemplary system 100 is able to detect and/or measuring a remaining capacity of the battery in these conditions (e.g., being charged, discharged, and a combination of both).

In one embodiment, referring to FIG. 1, while a battery is in use, either being discharged, charged, or both, the controller 104 determines a virtual reference voltage of the battery and uses the determined virtual reference voltage of the battery to estimate a capacity of the battery. In a particular embodiment, the virtual reference voltage may be a virtual open circuit voltage, which is equivalent to a voltage measured when the battery is "resting" (e.g., without any load). Throughout this application, a virtual open circuit voltage is used as a virtual reference voltage. It will be appreciated that other reference voltage with load may also be utilized.

Figure 2B:
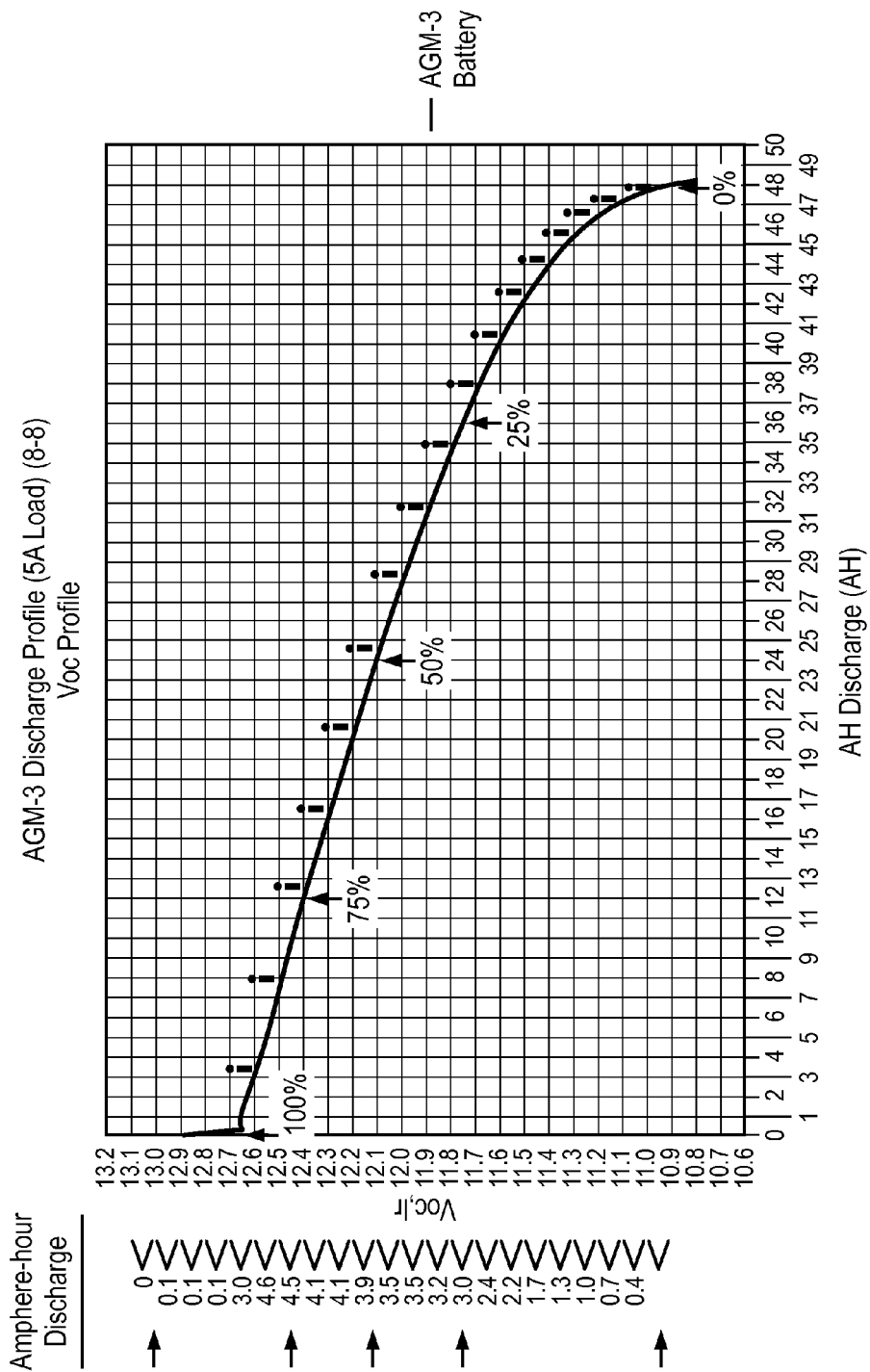

In one embodiment, the capacity of the battery may be estimated via a curve representing a relationship between the open circuit voltages and the capacity of the battery, as illustrated in FIG. 2A. The data shown in FIG. 2A may be implemented, for example, as a lookup table that is stored in storage within the monitoring device 103 (not shown). Alternatively, the curve shown in FIG. 2A may be implemented as a formula that the controller 104 may use to derive the capacity of the battery in response to a measured open circuit voltage, for example, in real time. The curve shown in FIG. 2A is also referred to as a virtual calibration curve. The data forming the virtual calibration curve may be collected prior to releasing the battery from a manufacturer. In one embodiment, the data may be collected based on one or more characteristics of the battery. Alternatively, the data may be collected and the virtual calibration curve may be generated while the battery is being used (e.g., trained while the battery is being used). Note that the virtual calibration curve is shown in FIG. 2A for the purposes of illustration only. The virtual calibration curve may be formed specifically dependent upon a specific type of the battery. This technique may be applied to various types of batteries, such as, for example, load acid battery or an AGM battery, etc. FIG. 2B is a diagram illustrating an exemplary virtual calibration curve for an AGM compatible battery according to one embodiment of the invention. Detailed information regarding how to determine the open circuit voltage of the battery will be described further below.

Referring back to FIG. 1, the monitoring device 103 of the exemplary system 100 may further include a communication interface, such as, for example, a network interface, a modem, and/or a wireless transceiver, that can communicate with a remote device 107 over a communication media 106. The communication media 106 may be a network, such as, for example, a local area network (LAN) or a wide area network (WAN) (e.g., Internet). The network may be wireless network, such as, IEEE 802.1x or a cellular network. The remote system 107 may be a computer system or server. System 107 may be used as a data center to collect data from the monitoring device 103. Alternatively, certain data (e.g., historic data may also be stored in either the monitoring device 103, the remote system 107, or the both. The information stored in the monitoring device 103 and the remote system 107 may be exchanged over the communication network 106. For example, certain virtual calibration data of certain batteries may be stored in the remote system 107. When the monitoring device 103 determines what kind of batteries it is monitoring, the monitoring device 103 may download the corresponding virtual calibration data from the remote system 107 over the network 106. Thereafter, the monitoring device 103 may measure one or more characteristics of the battery, such as, for example, the capacity of the battery. Alternatively, if the virtual calibration data of a new type of battery is not available from system 107, monitor 103 may generate (e.g., train) a new set of calibration data for the new battery while it is being used. The generated new calibration data may be transmitted from monitor 103 to data system 107 in real time or off line. Other configurations may exist.

Figure 2C:
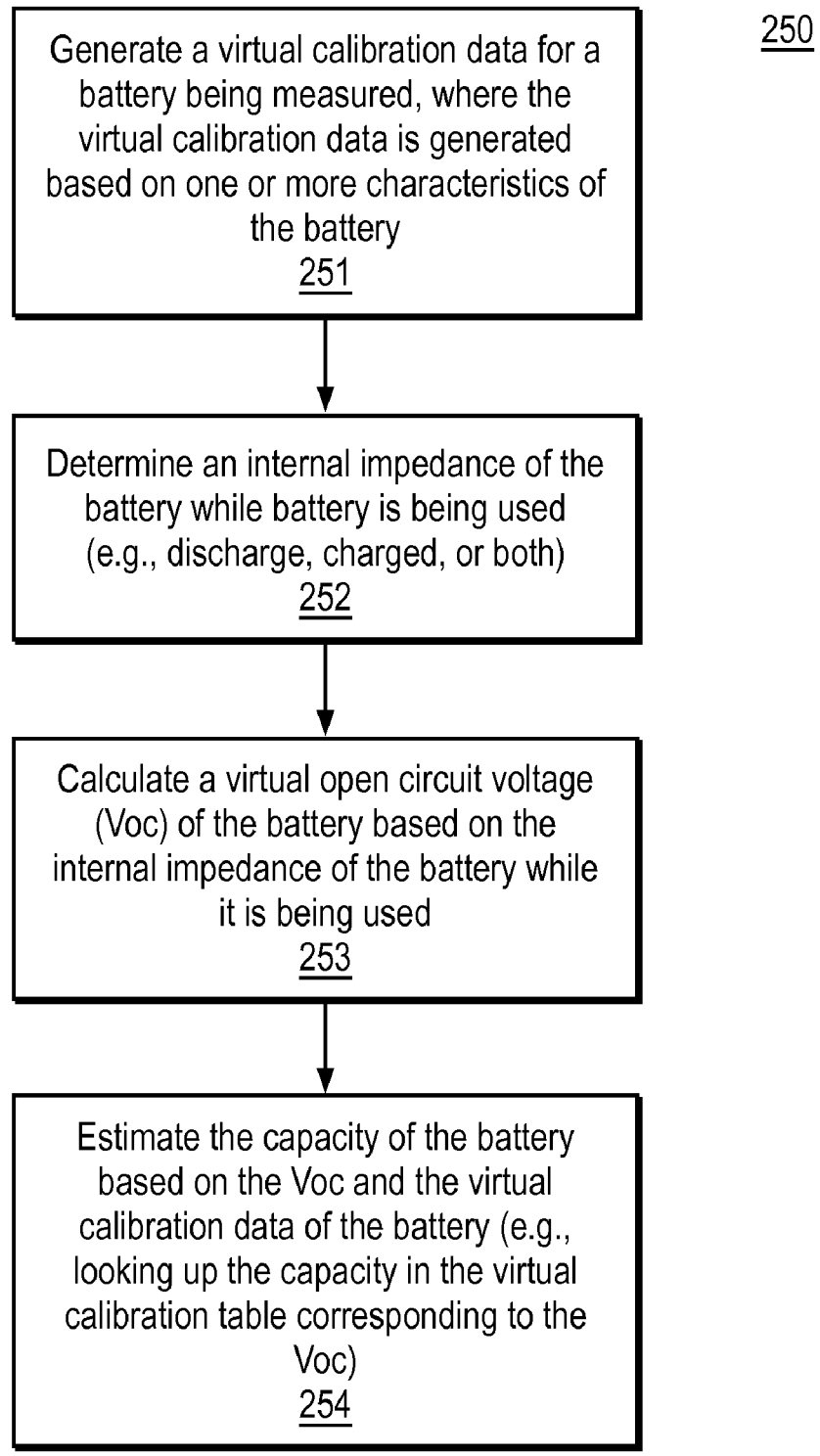
FIG. 2C is a flow diagram illustrating an example of a process for measuring a capacity of a battery according to one embodiment of the invention.

FIG. 2C is a flow diagram illustrating an example of a process for measuring a capacity of a battery according to one embodiment of the invention. Exemplary process 250 may be performed by a processing logic that may comprises hardware (circuitry, dedicated logic, etc.), software (such as is run on a dedicated machine), or a combination of both. For example, the exemplary process 250 may be performed by monitoring device 103 of exemplary system 100 of FIG. 1.

Referring to FIG. 2C, at block 251, a virtual calibration data for a battery being measured is generated, where the virtual calibration data is generated based on one or more characteristics of the battery being measured. In one embodiment, the virtual calibration data may be stored as a look up table or a calculation formula to determine the capacity of the battery, such as, for example, similar to the curves as shown in FIGS. 2A and 2B. At block 252, an internal impedance of the battery is determined while the battery is being used. At block 253, a virtual open circuit voltage (Voc) of the battery is determined based on the internal impedance of the battery while the battery is being used. In one embodiment, the internal impedance and/or Voc of the battery may be determined dependent upon how the battery is being used, such as, for example, discharged, charged, or a combination of both, which will be described in details further below. At block 254, the capacity of the battery is estimated using the Voc and virtual calibration data associated with the battery. For example, according to one embodiment, the estimate of the capacity of the battery may be determined by looking up within the virtual calibration table associated with the battery corresponding to the Voc of the battery. Other operations may also be performed.

Determining Battery Capacity While Being Discharged

Figure 3A:
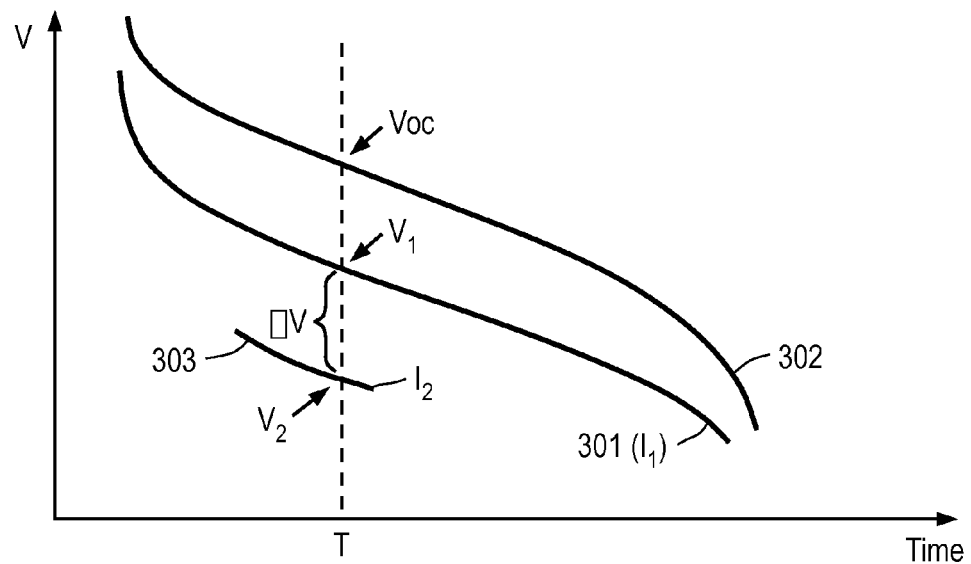
FIGS. 3A and 3B are diagrams illustrating an exemplary mechanism for determining a battery capacity according to one embodiment of the invention.
Figure 3B:
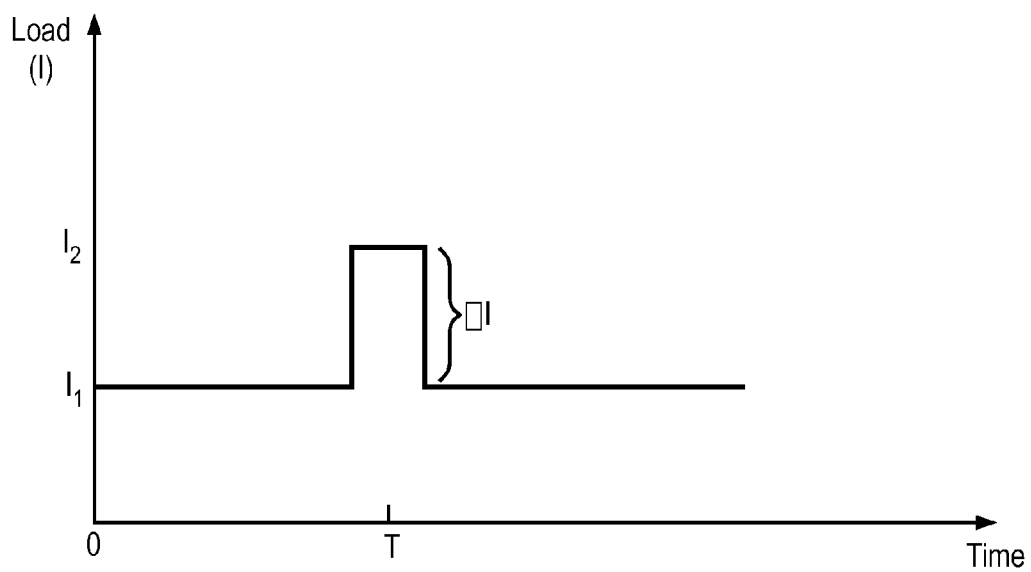

FIGS. 3A and 3B are diagrams illustrating an exemplary mechanism for determining a battery capacity according to one embodiment of the invention. Referring to FIGS. 3A and 3B, in one embodiment, the battery being monitored is being discharged with a first load $I_1$, which is represented by a discharge curve 301. At the time of T, the corresponding voltage of the battery may be measured as $V_1$, given the first load $I_1$. In addition, according to one embodiment, the monitoring device applies an additional load $I_2$ to the battery and measures the voltage across the battery as $V_2$, which is represented by curve 302. Then internal impedance is derived based on the measured $V_1$, $V_2$, $I_1$, and $I_2$. In one embodiment, the internal impedance $R_i$ may be determined as follows:

$$R_i = \Delta V / \Delta I = |V_2 - V_1| / |I_2 - I_1|$$

Thereafter, the open circuit voltage $V_{oc}$ of the battery may be determined based on the first voltage $V_1$ and is corresponding load $I_1$, as well as the internal impedance $R_i$. In one embodiment, the open circuit voltage $V_{oc}$ may be determined as follows:

$$V_{oc} = V_1 + I_1 R_i$$

Once the open circuit voltage $V_{oc}$ is determined, the capacity of the battery corresponding to the $V_{oc}$ may be estimated, for example, using the corresponding virtual calibration curve shown in FIGS. 2A and 2B, either through a lookup table or a predetermined formula.

FIG. 4 is a flow diagram illustrating an exemplary process for determining a capacity of a battery according to one embodiment of the invention. Exemplary process 400 may be performed by a processing logic that may comprise hardware (circuitry, dedicated logic, etc.), software (such as is run on a dedicated machine), or a combination of both. For example, the exemplary process 400 may be performed by monitoring device 103 of exemplary system 100 of FIG. 1.

Referring to FIG. 4, at block 401, a first voltage (e.g., $V_1$) is measured while the battery is discharged by a first load (e.g., $I_1$). At block 402, a second load (e.g., $I_2$) is applied to the battery, in addition to the first load. At block 403, a second voltage (e.g., $V_2$) is measured while the first and second loads are applied to the battery. At block 404, an internal impedance of the battery (e.g., $R_i$) is determined based on the first and second loads, as well as the first and second voltages corresponding to the first and second loads. In one embodiment, the internal impedance of the battery may be determined using the exemplary formula described above with respect to FIGS. 3A and 3B. At block 405, a virtual reference voltage is determined based on the first load, the first voltage, and the internal impedance. In one embodiment, an open circuit voltage may be used as the virtual reference voltage, which may be determined using the exemplary formula described above with respect to FIGS. 3A and 3B. Thereafter, at block 406, the capacity of the battery may be determined based on the virtual reference voltage. The capacity of the battery may be determined via a lookup table or a formula based on the virtual reference voltage. Other operations may also be performed.

Determining Battery Capacity White Being Charged

Figure 5A:
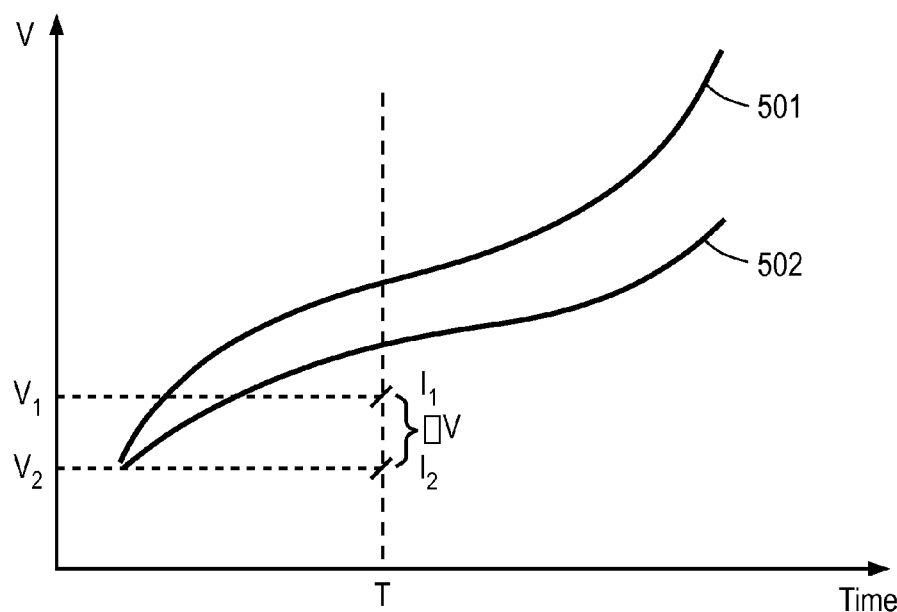
FIG. 5A and 5B are diagrams illustrating an exemplary mechanism for determining a battery capacity according to another embodiment of the invention.
Figure 5B:
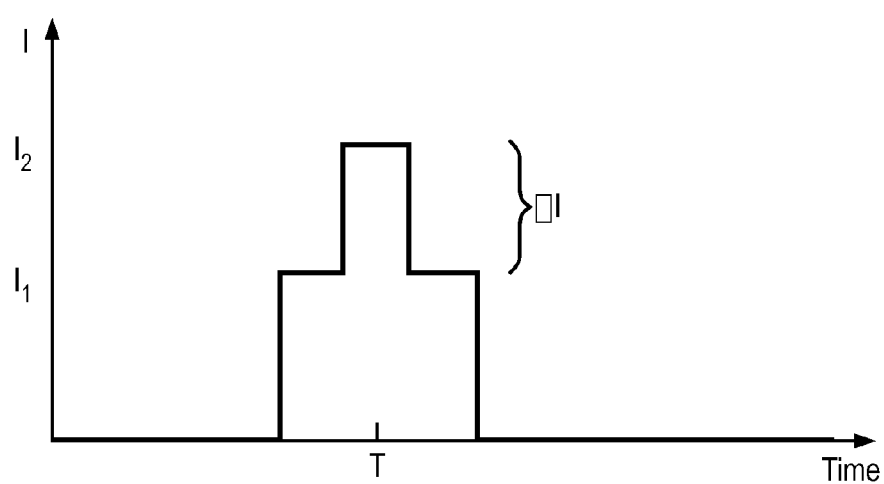

FIGS. 5A and 5B are diagrams illustrating an exemplary mechanism for determining a battery capacity according to another embodiment of the invention. Referring to FIGS. 5A and 5B, in one embodiment, a battery being monitored is being charged without a load, which is represented by a charge current $I_{CH}$ and a charge curve 501. At the time of T, a first load $I_1$, which is greater than $I_{CH}$, is applied to the battery while the battery is being charged and the corresponding voltage of the battery may be measured as $V_1$, given the first load $I_1$. In addition, while the first load $I_1$ is still applied, according to one embodiment, the monitoring device applies an additional load $I_2$ to the battery and measures the voltage across the battery as $V_2$. Then internal impedance is derived based on the measured $V_1$, $V_2$, $I_1$, and $I_2$. In one embodiment, the internal impedance $R_i$ may be determined as follows:

$$R_i = \Delta V / \Delta I = |V_2 - V_1| / |I_2 - I_1|$$

Thereafter, the open circuit voltage of the battery may be determined based on the first voltage $V_1$ and its corresponding load $I_1$, as well as the internal impedance $R_i$. In one embodiment, the open circuit voltage $V_{oc}$ may be determined as follows:

$$V_{oc} = V_1 + \Delta I\, R_i = V_1 + |I_1 - I_{CH}| R_i$$

Once the open circuit voltage $V_{oc}$ is determined, the capacity of the battery corresponding to the $V_{oc}$ may be estimated, for example, using the corresponding virtual calibration curve shown in FIGS. 2A and 2B, either through a lookup table or a predetermined formula.

FIG. 6 is a flow diagram illustrating an exemplary process for determining a capacity of a battery according to another embodiment of the invention. Exemplary process 600 may be performed by a processing logic that may comprise hardware (circuitry, dedicated logic, etc.), software (such as is run on a dedicated machine), or a combination of both. For example, the exemplary process 600 may be performed by monitoring device 103 of exemplary system 100 of FIG. 1.

Referring to FIG. 6, at block 601, a first load (e.g., $I_1$), which is greater than charge current $I_{CH}$, is applied to the battery while the battery is being charged and a first voltage (e.g., $V_1$) is measured while the first load is being applied. At block 602, a second load (e.g., $I_2$) is applied to the battery, in addition to the first and load and a second voltage (e.g., $V_2$) is measured while the first and second loads are applied to the battery. At block 603, an internal impedance of the battery (e.g., $R_i$) is determined based on the first and second loads, as well as the first and second voltages corresponding to the first and second loads. In one embodiment, the internal impedance of the battery may be determined using the exemplary formula described above with respect to FIGS. 5A and 5B. At block 604, a virtual reference voltage is determined based on the first load, the first voltage, and the internal impedance. In one embodiment, an open circuit voltage may be used as the virtual reference voltage, which may be determined using the exemplary formula described above with respect to FIGS. 5A and 5B. Thereafter, at block 605, the capacity of the battery may be determined based on the virtual reference voltage. The capacity of the battery may be determined via a lookup table or a formula based on the virtual reference voltage. Other operations may also be performed.

Determining Battery Capacity While Being Charged And Discharged

Figure 7:
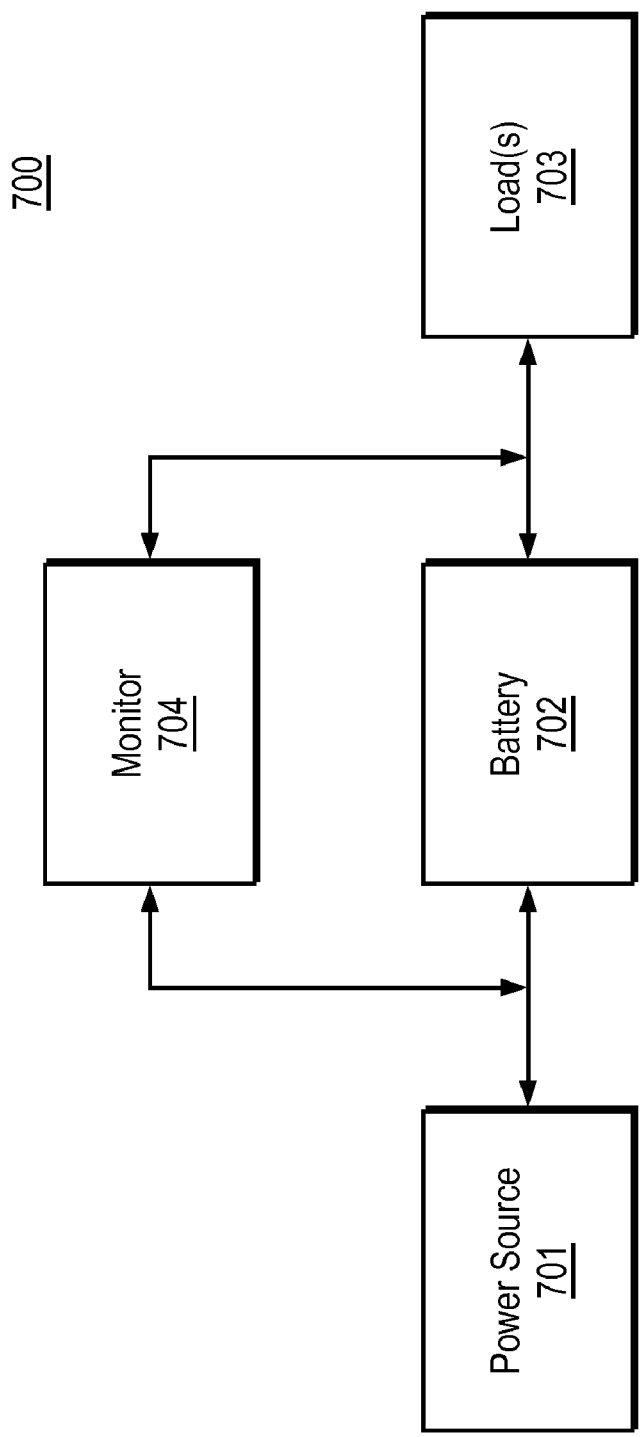
FIG. 7 is a block diagram illustrating an exemplary battery monitoring system according to another embodiment of the invention.

FIG. 7 is a block diagram illustrating an exemplary battery monitoring system according to another embodiment of the invention. In this embodiment, the battery is being charged and discharged substantially simultaneously. Referring to FIG. 7, battery 702 is being charged by a power source 701 and discharged by a load 703 substantially concurrently. In addition, a monitoring device 704 is coupled to both the input and the output of the battery to monitor the charging current between the power source 701 and the battery 702 and the discharging current between the battery 702 and load 703. In one embodiment, the monitoring device 704 applies one or more additional loads and measures the voltages corresponding to the additional loads respectively. The internal impedance of the battery is then determined based on the measured voltages as well as the various different loads being applied to the battery. Thereafter, the virtual reference voltage (e.g., virtual open circuit voltage) is then determined and the battery capacity is estimated based on the virtual reference voltage.

Figure 8:
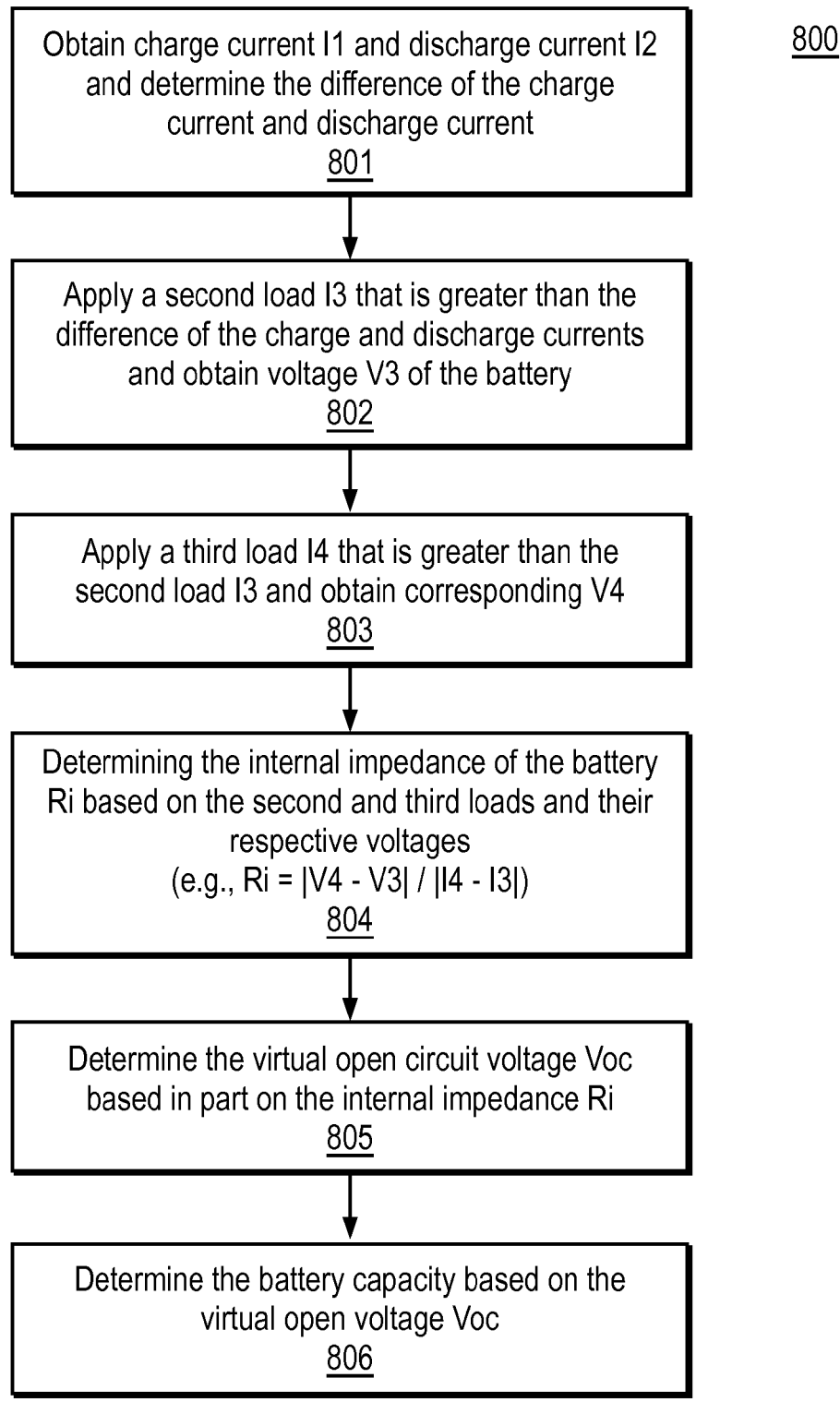
FIG. 8 is a flow diagram illustrating an exemplary process for determining a battery capacity according to another embodiment of the invention.

FIG. 8 is a flow diagram illustrating an exemplary process for determining a battery capacity according to another embodiment of the invention. Exemplary process 800 may be performed by a processing logic that may comprise hardware (circuitry, dedicated logic, etc.), software (such as is run on a dedicated machine), or a combination of both. For example, the exemplary process 800 may be performed by monitoring device 704 of exemplary system 700 of FIG. 7. In this embodiment, the battery is being charged and discharged substantially simultaneously.

Referring to FIG. 8, at block 801, a charging current $I_1$ and discharging current $I_2$ are measured and the difference of the charging and discharging currents $\Delta I$ is obtained, wherein $\Delta I = I_1 - I_2$. At block 802, a second load $I_3$ is applied to the battery in addition to the discharging current $I_2$, where $I_3$ is greater than $\Delta I$. The voltage of the battery $V_3$ is measured while $I_1$, $I_2$, and $I_3$ are applied. At block 803, a third load $I_4$ is applied to the battery in addition to $I_2$ and $I_3$, where $I_4$ is greater than $I_3$. The voltage $V_4$ is measured while $I_1$, $I_2$, $I_3$, and $I_4$ are applied. At block 804, the internal impedance of the battery $R_i$ is determined based on $V_3$, $V_4$, $I_3$, and $I_4$. In one embodiment, the internal impedance $R_i$ is determined as follows:

$$R_i = |V_4 - V_3| / |I_4 - I_3|$$

At block 805, the virtual open circuit voltage $V_{oc}$ is determined based at least in part on the determined internal impedance $R_i$. In one embodiment, the $V_{oc}$ may be determined as follows:

$$V_{oc} = V_3 + R_i |I_3 - \Delta I|$$

Alternatively, the $V_{oc}$ may be determined as follows:

$$V_{oc} = V_4 + R_i |I_4 - \Delta I|$$

Thereafter, at block 806, the capacity of the battery may be determined based on Voc (also referred to a virtual reference voltage). The capacity of the battery may be determined via a lookup table or a formula based on the virtual reference voltage. Other operations may also be performed.

Alternative Embodiment For Determining Battery Capacity

FIG. 9 is a block diagram illustrating an exemplary mechanism for determining a battery capacity according to another embodiment of the invention. Referring to FIG. 9, in this embodiment, a lookup table 900 is provided for estimating a capacity of a battery. For example, values of the lookup table 900 may be trained via a variety of experiments for a given type of battery prior to being utilized. In one embodiment, the exemplary lookup table 900 includes an array of fields 901 for dividing a range of battery capacity into a predetermined number of segments, such as, for example, 100 segments. Each segment corresponds to a range of virtual reference voltages 902, where each of the virtual reference voltages 902 may be determined using at least one of the above techniques, dependent upon the specific configurations.

For each range of the virtual reference voltages 902, an estimate of the battery life consumed during the respective virtual reference voltage range and the corresponding remaining battery capacity may be specified in fields 903 and 904 respectively. For example, according to one embodiment, for a given Voc, which is measured using one or more techniques described above dependent upon whether the battery is being charged, discharged, or both, an estimate of the battery capacity may be determined by looking up a segment 901 that contains the Voc and the corresponding battery capacity 904 in percentage of a remaining battery capacity.

According to another embodiment, the capacity of a battery may be measured in "ampere hour" (AH) unit, for example, consumed and/or remained in the battery. In one embodiment, the battery life consumed in AH may be measured by an average load (e.g., current) consumed in a period of time. Such a measurement may be performed using a current sensor and/or a timer within a battery monitoring system, such as exemplary system 100 of FIG. 1. For example, one AH may be determined by an average current of 2 amperes consumed for approximately half hour, etc.

In one embodiment, the virtual references voltages may be determined based on either full range measurements (e.g., all 100 segments) using a scheme specified in field 905. In a specific embodiment, for a given Voc, the capacity of the battery may be estimated by summing the AHs in field 903 from the segment corresponding to the Voc to the rest of the segments. For example, when a Voc 903 falls within a range of 13.0-12.9 corresponding to segment 2 of field 901, the capacity of the battery 905 may be determined be summing from segment 2 to segment 100 of AH field 903, which represents a total AHs remained in the battery.

Alternatively, other schemes may be utilized based on partial usage of the battery. For example, if the battery is normally used up to approximately 50% of its full capacity, the virtual reference voltages may be determined according to a scheme shown in field 906. Similarly, if the batter is normally used up to approximately 25% of its full capacity, the virtual reference voltages may be determined according to a scheme shown in field 907. Other schemes 908 may be implemented dependent upon a specific configuration.

Furthermore, according to one embodiment, certain ranges or portions of the virtual calibration curve of a typical battery is relatively linear. For example, as shown in FIG. 2B, a virtual calibration curve of an AGM battery includes a relatively linear region from approximately 25% to 75%. As a result, once the slope of the virtual calibration curve is determined using at least one of the techniques described above, if the corresponding battery life falls within a region ranging approximately from 25% to 75%, a virtual reference voltage may be derived from another virtual reference voltage based on the determined slope (e.g., based on a linear relationship). The non-linear region of the virtual calibration curve may be compensated via a lookup table. Other configurations may also be implemented.

Exemplary Data Processing System

Figure 10:
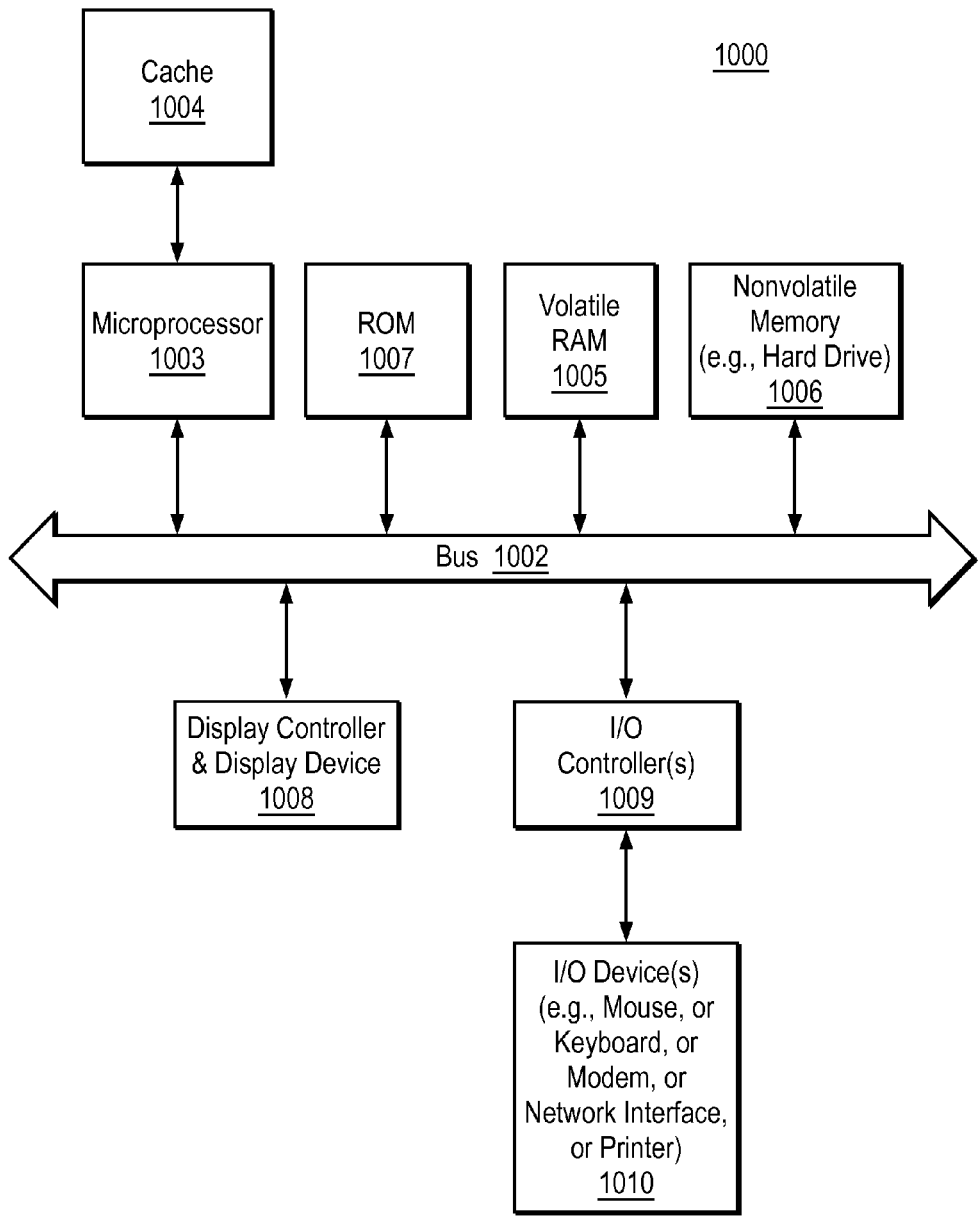
FIG. 10 is a block diagram illustrating an exemplary data processing system which may be used in one embodiment of the invention.

FIG. 10 is a block diagram illustrating an exemplary data processing system which may be used in one embodiment of the invention. For example, the exemplary system 1000 may be used as monitoring device 103 of FIG. 1 and/or monitoring device 703 of FIG. 7. Note that while FIG. 10 illustrates various components of a computer system, it is not intended to represent any particular architecture or manner of interconnecting the components, as such details are not germane to the present invention. It will also be appreciated that network computers, handheld computers, cell phones, and other data processing systems which have fewer components or perhaps more components may also be used with the present invention.

As shown in FIG. 10, the computer system 1000, which is a form of a data processing system, includes a bus 1002 which is coupled to a microprocessor 1003 and a ROM 1007, a volatile RAM 1005, and a non-volatile memory 1006. The microprocessor 1003, which may be, for example, a PIC16-F716 processor from Microchip corporation, a Pentium processor from Intel Corporation or a PowerPC processor from Motorola, Inc., is coupled to cache memory 1004 as shown in the example of FIG. 10. Alternatively, processor 1003 may be embedded micro-controller, FPGA, or ASIC, etc. The bus 1002 interconnects these various components together and also interconnects these components 1003, 1007, 1005, and 1006 to a display controller and display device 1008, as well as to input/output (I/O) devices 1010, which may be mice, keyboards, modems, network interfaces, printers, and other devices which are well-known in the art.

Typically, the input/output devices 1010 are coupled to the system through input/output controllers 1009. The volatile RAM 1005 is typically implemented as dynamic RAM (DRAM) which requires power continuously in order to refresh or maintain the data in the memory. The non-volatile memory 1006 is typically a magnetic hard drive, a magnetic optical drive, an optical drive, or a DVD RAM or other type of memory system which maintains data even after power is removed from the system. Typically, the non-volatile memory will also be a random access memory, although this is not required. While FIG. 10 shows that the non-volatile memory is a local device coupled directly to the rest of the components in the data processing system, it will be appreciated that the present invention may utilize a non-volatile memory which is remote from the system; such as, a network storage device which is coupled to the data processing system through a network interface such as a modem or Ethernet interface.

The bus 1002 may include one or more buses connected to each other through various bridges, controllers, and/or adapters, as is well-known in the art. In one embodiment, the I/O controller 1009 includes a USB (Universal Serial Bus) adapter for controlling USD peripherals or a PCI controller for controlling PCI devices, which may be included in IO devices 1010. In a further embodiment, I/O controller 1009 includes an IEEE-1394 controller for controlling IEEE-1394 devices, also known as FireWire devices. Other components may also be implemented.

Thus, methods and apparatuses for determining battery capacity have been described. In the foregoing specification, the invention has been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A method for measuring a capacity of a battery, the method comprising:
    generating virtual calibration data of the battery based on one or more characteristics of the battery;
    determining an internal impedance ($R_i$) of the battery, including
        applying a first load ($I_1$) across the battery,
        measuring a first voltage ($V_1$) across the battery while the battery is being applied with the first load ($I_1$),
        applying a second load ($I_2$) to the battery for a predetermined time duration in addition to the first load ($I_1$), and
        measuring, during the predetermined time duration, a second voltage ($V_2$) across the battery in view of the first load ($I_1$) and the second load ($I_2$), wherein the internal impedance is determined based on at least a portion of $V_1$, $V_2$, $I_1$, and $I_2$;
    determining a virtual open circuit voltage ($V_{oc}$) of the battery based on the internal impedance of the battery while the battery is being used; and
    estimating the capacity of the battery based on the determined virtual open circuit voltage of the battery and the virtual calibration data of the battery, while the battery is being used.

2. The method of claim 1, wherein the battery is being discharged by the first load when the capacity of the battery is estimated.

3. The method of claim 2, wherein the internal impedance ($R_i$) of the battery is determined as follows, while the battery is being discharged:

$$R_i = |V_2 - V_1| / |I_2 - I_1|.$$

4. The method of claim 3, wherein the virtual open circuit voltage ($V_{oc}$) of the battery is determined as follows, while the battery is being discharged:

$$V_{oc} = V_1 + I_1 * R_i.$$

5. The method of claim 1, wherein the battery is being charged by a charging current ($I_{ch}$) when the first load ($I_1$) is being applied, and wherein the virtual open circuit voltage ($V_{oc}$) of the battery is determined further based on the charging current ($I_{ch}$).

6. The method of claim 5, wherein the internal impedance ($R_i$) of the battery is determined as follows, while the battery is being charged:

$$R_i = |V_2 - V_1| / |I_2 - I_1|.$$

7. The method of claim 6, wherein the virtual open circuit voltage ($V_{oc}$) of the battery is determined as follows, while the battery is being charged:

$$V_{oc} = V_1 + |I_1 - I_{ch}| * R_i.$$

8. A method for measuring a capacity of a battery, the method comprising:
    generating virtual calibration data of the battery based on one or more characteristics of the battery;

determining a virtual open circuit voltage ($V_{oc}$) of the battery while the battery is being used;

determining an internal impedance ($R_i$) of the battery, wherein the virtual open circuit voltage of the battery is determined based on the internal impedance of the battery; and estimating the capacity of the battery based on the determined virtual open circuit voltage of the battery and the virtual calibration data of the battery while the battery is being used, wherein the battery is being discharged and charged substantially concurrently when the capacity of the battery is estimated, including obtaining a difference ($\Delta I$) between a charge current ($I_1$) and a discharge current ($I_2$) while the battery is being discharged and charged substantially concurrently,

*applying a second load ($I_3$) that is grater than $\Delta I_4$,* measuring a second voltage ($V_3$) across the battery while the second load ($I_3$) is being applied, applying a third load ($I_4$) that is grater than the second load ($I_3$), and measuring a third voltage ($V_4$) across the battery in view of the second load ($I_3$) and the third load ($I_4$), wherein at least one of the internal impedance and virtual open circuit voltage ($V_{oc}$) of the battery is determined based on at least a portion of $V_3$, $V_4$, $I_1$, $I_2$, $I_3$, and $I_4$.

9. The method of claim 8, wherein the internal impedance ($R_i$) of the battery is determined as follows:

$R_i=|V_4-V_3|/|I_4-I_3|$.

10. The method of claim 9, wherein the virtual open circuit voltage ($V_{oc}$) of the battery is determined as follows:

$V_{oc}=V_3+R_i|I_3-\Delta I|$.

11. The method of claim 9, wherein the virtual open circuit voltage ($V_{oc}$) of the battery is determined as follows:

$V_{oc}=V_4+R_i|I_4-\Delta I|$.

12. The method of claim 1, wherein the virtual calibration data of the battery is generated based on a type of the battery and stored as a lookup table for looking up the capacity of the battery in real time based on the determined virtual open circuit voltage ($V_{oc}$).

13. The method of claim 12, further comprising:

dividing a battery capacity represented by the lookup table into a plurality of segments maintained within the lookup table, each segment corresponding to a range of virtual reference voltages; and in response to the determined virtual open circuit voltage ($V_{oc}$), determining the battery capacity by looking up within the lookup table a battery capacity corresponding to a range of virtual reference voltage that contains the determined Voc.

14. An apparatus for measuring a capacity of a battery, comprising:

a database to maintain virtual calibration data of the battery based on one or more characteristics of the battery; and a controller to determine an internal impedance ($R_i$) of the battery, including applying a first load ($I_t$) across the battery, measuring a first voltage ($V_1$) across the battery while the battery is being applied with the first load ($I_1$), applying a second load ($I_2$) to the battery for a predetermined time duration in addition to the first load ($I_1$), and measuring, during the predetermined time duration, a second voltage ($V_2$) across the battery in view of the first load ($I_1$) and the second load ($I_2$), wherein the internal impedance is determined based on at least a portion of $V_1$, $V_2$, $I_1$, and $I_2$, wherein the controller is configured to determine a virtual open circuit voltage ($V_{oc}$) of the battery based on the internal impedance of the battery while the battery is being used, wherein the controller is configured to estimate the capacity of the battery based on the determined virtual open circuit voltage of the battery and the virtual calibration data of the battery stored on the database while the battery is being used.

15. The apparatus of claim 14, wherein the battery is being discharged when the capacity of the battery is estimated, and wherein the controller is configured further to measure a first voltage ($V_1$) across the battery while the battery is being discharged by a first load ($I_1$), apply a second load ($I_2$) to the battery in addition to the first load ($I_1$), and measure a second voltage ($V_2$) across the battery in view of the first load ($I_1$) and the second load ($I_2$), wherein at least one of the internal impedance and virtual open circuit voltage ($V_{oc}$) of the battery is determined based on at least a portion of $V_1$, $V_2$, $I_1$, and $I_2$.

16. The apparatus of claim 14, wherein the battery is being charged when the capacity of the battery is estimated, and wherein the controller is configured further to apply a first load ($I_1$) to the battery while the battery is being charged with a charging current ($I_{ch}$), measure a first voltage ($V_1$) across the battery while the first load ($I_1$) is being applied to the battery, apply a second load ($I_2$) to the battery in addition to the first load ($I_1$) while the battery is being charged, and measured a second voltage ($V_2$) across the battery in view of the first load ($I_1$) and the second load ($I_2$) while the battery is being charged, wherein at least one of the internal impedance and virtual open circuit voltage ($V_{oc}$) of the battery is determined based on at least a portion of $V_1$, $V_2$, $I_{ch}$, $I_1$, and $I_2$.

17. An apparatus for measuring a capacity of a battery, comprising:

a database to maintain virtual calibration data of the battery based on one or more characteristics of the battery; and a controller to determine a virtual open circuit voltage ($V_{oc}$) of the battery while the battery is being used, wherein the controller is configured to estimate the capacity of the battery based on the determined virtual open circuit voltage of the battery and the virtual calibration data of the battery stored on the database while the battery is being used, wherein the controller is configured further to determine an internal impedance ($R_i$) of the battery, wherein the virtual open circuit voltage of the battery is determined based on the internal impedance of the battery, wherein the battery is being discharged and charged substantially concurrently when the capacity of the battery is estimated, and wherein the controller is configured further to obtain a difference ($\Delta I$) between a charge current ($I_1$) and a discharge current ($I_2$) while the battery is being discharged and charged substantially concurrently, apply a second load ($I_3$) that is grater than $\Delta I$, measure a second voltage ($V_3$) across the battery while the second load ($I_3$) is being applied, apply a third load ($I_4$) that is grater than the second load ($I_3$), and measure a third voltage ($V_4$) across the battery in view of the second load ($I_3$) and the third load ($I_4$), wherein at least one of the internal impedance and virtual open circuit voltage ($V_{oc}$) of the battery is determined based on at least a portion of $V_3$, $V_4$, $I_1$, $I_2$, $I_3$, and $I_4$.

18. An apparatus for measuring a capacity of a battery, comprising:

means for generating virtual calibration data of the battery based on one or more characteristics of the battery;

means for determining an internal impedance ($R_i$) of the battery, including means for applying a first load ($I_1$) across the battery, means for measuring a first voltage ($V_1$) across the battery while the battery is being applied with the first load ($I_1$), means for applying a second load ($I_2$) to the battery for a predetermined time duration in addition to the first load ($I_1$), and means for measuring, during the predetermined time duration, a second voltage ($V_2$) across the battery in view of the first load ($I_1$) and the second load ($I_2$), wherein the internal impedance is determined based on at least a portion of $V_1$, $V_2$, $I_1$, and $I_2$;

means for determining a virtual open circuit voltage (Voc) of the battery based on the internal impedance of the battery while the battery is being used; and means for estimating the capacity of the battery based on the determined virtual open circuit voltage of the battery and the virtual calibration data of the battery, while the battery is being used.

\* \* \* \* \*